(12) United States Patent
Bickel et al.

(10) Patent No.: US 9,778,295 B2
(45) Date of Patent: Oct. 3, 2017

(54) SYSTEM AND METHOD TO MEASURE NEUTRAL-TO-GROUND VOLTAGE

(75) Inventors: Jon A. Bickel, Murfreesboro, TN (US); E. Avery Ashby, Murfreesboro, TN (US)

(73) Assignee: SCHNEIDER ELECTRIC USA, INC., Andover, MA (US)

(*) Notice: Subject to any disclaimer, the term of this patent is extended or adjusted under 35 U.S.C. 154(b) by 1497 days.

(21) Appl. No.: 13/342,014

(22) Filed: Dec. 31, 2011

(65) Prior Publication Data
US 2013/0169269 A1    Jul. 4, 2013

(51) Int. Cl.
G01R 31/08    (2006.01)
G01R 19/25    (2006.01)
H02J 13/00    (2006.01)

(52) U.S. Cl.
CPC ...... *G01R 19/2513* (2013.01); *H02J 13/0075* (2013.01); *H02J 13/0086* (2013.01); *Y02E 60/724* (2013.01); *Y02E 60/74* (2013.01); *Y02E 60/7853* (2013.01); *Y04S 10/18* (2013.01); *Y04S 10/30* (2013.01); *Y04S 40/126* (2013.01)

(58) Field of Classification Search
CPC ............. G01R 19/2513; Y02E 60/7853; Y04S 40/126; Y04S 10/30
USPC ........................................ 324/522, 500, 512
See application file for complete search history.

(56) References Cited

U.S. PATENT DOCUMENTS

| | | | |
|---|---|---|---|
| 5,446,682 A | 8/1995 | Janke et al. | |
| 5,495,384 A * | 2/1996 | Wallis | G01R 13/06 361/42 |
| 5,793,593 A * | 8/1998 | Reed | H02G 3/00 307/90 |
| 5,886,597 A * | 3/1999 | Riad | H01P 3/088 174/250 |
| 5,929,554 A * | 7/1999 | Kanayama | H01L 41/107 310/359 |
| 6,049,469 A * | 4/2000 | Hood, III | G06F 1/182 174/388 |
| 6,108,180 A * | 8/2000 | Severino | H02H 9/08 361/118 |
| 7,272,518 B2 | 9/2007 | Bickel et al. | |
| 7,684,940 B2 | 3/2010 | Bickel | |
| 2006/0083260 A1* | 4/2006 | Wang | H04L 67/025 370/463 |
| 2007/0055889 A1 | 3/2007 | Henneberry et al. | |
| 2008/0215264 A1 | 9/2008 | Spanier et al. | |
| 2008/0238436 A1 | 10/2008 | Bickel | |
| 2009/0079418 A1 | 3/2009 | Stegen et al. | |

(Continued)

FOREIGN PATENT DOCUMENTS

CN    202094698 U    12/2011
DE    102007003145 A1    7/2008

OTHER PUBLICATIONS

PCT International Search Report dated Oct. 17, 2013 in International Application No. PCT/US2012/072127, filed Dec. 28, 2012.

(Continued)

*Primary Examiner* — Giovanni Astacio-Oquendo
(74) *Attorney, Agent, or Firm* — Lando & Anastasi, LLP (57) ABSTRACT

A method and program for minimizing objectionable currents while still providing neutral-to-ground voltage measurements by controlling a switch to determine when the neutral-to-ground impedance is placed in an electrical circuit.

11 Claims, 7 Drawing Sheets

(56) References Cited

U.S. PATENT DOCUMENTS

2009/0096654 A1* 4/2009 Zhu .................... H03M 1/0682
                                                    341/155
2009/0228224 A1* 9/2009 Spanier ................. G01R 22/10
                                                    702/60

OTHER PUBLICATIONS

PCT Written Opinion of the International Searching Authority dated Oct. 17, 2013 in International Application No. PCT/US2012/072127, filed Dec. 28, 2012.

* cited by examiner

SYSTEM AND METHOD TO MEASURE NEUTRAL-TO-GROUND VOLTAGE

BACKGROUND

1. Technical Field

Embodiments of the present invention relate generally to energy and power management or monitoring and, more particularly, to systems and methods for measuring neutral-to-ground voltages and reducing ground currents caused by the measurements.

2. Background Discussion

Providing relevant energy and power management solutions requires knowledge, and knowledge requires accurate data. Under certain circumstances, however, the act of acquiring data can undermine the validity of the data and may also adversely impact the system being measured.

Poor wiring and grounding practices have been found to be the primary cause of all power quality issues according to well-known Electric Power Research Institute (EPRI) studies conducted in the 1990s. Poorly designed and installed electrical systems not only can cause erratic operation of equipment, they can result in safety or fire hazards.

Wiring and grounding practices are critical to the safe and reliable operation of electrical systems. The National Fire Protection Agency (NFPA) produces a codebook (the NEC or National Electrical Code) that outlines appropriate wiring practices to provide "the practical safeguarding of persons and property from hazards arising from the use of electricity." This code is very thorough, and is relied upon by many international jurisdictions to reduce the risks associated with electricity, safeguarding equipment and personnel; it is essentially an instruction manual for the safe design and installation of wiring and grounding systems. The IEEE Emerald Book (IEEE Standard 1100-2005, *Recommended Practice for Powering and Grounding Electronic Equipment*) takes the NEC a step further and provides design and installation guidelines to reduce the impact of poor wiring and grounding practices where they could result in reliability or power quality issues (Note: IEEE Standard 1100-2005 is only a supplement to the NEC; in no way does it supplant the NEC).

Measuring the voltage potential between the grounded (neutral) connection and the ground reference provides valuable information with respect to safety and potential power quality issues. With that in mind, many meter manufacturers are now employing the capability to measure neutral-to-ground (N-G) voltages, even in their low-end devices. Some exemplary benefits of measuring and analyzing N-G voltage data include the following: detecting illegal N-G bonds (violations of the NEC); indicating of the need to consider installing a new separately derived source; distinguishing the relative location of a device (with respect to other devices) within an electrical subsystem; identifying potential impedance issues with the grounded (neutral) conductor; and verifying the continuity of grounded (neutral) and grounding (earth) conductors.

The 2011 NEC dedicates an entire section of the code (Article 250) to provide detailed instructions on configuring grounded electrical systems. For ease of reference and clarity of exposition, so that the concepts and embodiments described herein may be more clearly understood, the following sets forth the meaning of various terms as may be used herein, which meaning is also intended to be in accordance with the definition and use of these terms in the 2011 NEC Handbook, from which the following is directly based.

Bonded (Bonding)—Connected to establish electrical continuity and conductivity.

Effective Ground-Fault Current Path—An intentionally constructed, low-impedance electrically conductive path designed and intended to carry current during ground-fault conditions from the point of a ground fault on a wiring system to the electrical supply source and that facilitates the operation of the overcurrent protective device or ground-fault detectors on high-impedance grounded systems.

Ground—The earth.

Grounded (Grounding)—Connected (connecting) to ground or to a conductive body that extends the ground connection. (The neutral conductor is a grounded conductor).

Grounded Conductor—A system or circuit conductor that is intentionally grounded.

Grounding Conductor, Equipment (EGC)—The conductive path(s) installed to connect normally non-current-carrying metal parts of equipment together and to the system grounded conductor or to the grounding electrode conductor, or both. (AKA, typically green wire or bare copper wire).

Main Bonding Jumper—The connection between the grounded circuit conductor and the equipment grounding conductor at the service.

Neutral Conductor—The conductor connected to the neutral point of a system that is intended to carry current under normal conditions.

Separately Derived System—A premises wiring system whose power is derived from a source of electric energy or equipment other than a service. Such systems have no direct connection from circuit conductors of one system to circuit conductors of another system, other than connections through the earth, metal enclosures, metallic raceways, or equipment grounding conductors.

System Bonding Jumper—The system bonding jumper performs the same electrical function as the main bonding jumper in a grounded ac (i.e., alternating current) system by connecting the equipment grounding conductor(s) to the grounded circuit conductor either at the source of a separately derived system or at the first disconnecting means supplied by the source. The term 'system bonding jumper' is used to distinguish it from the main bonding jumper, which is installed in service equipment. A system bonding jumper is used at the derived system if the derived system contains a grounded conductor. Like the main bonding jumper at the service equipment, the system bonding jumper provides the necessary link between the equipment grounding conductors and the system grounded conductor in order to establish an effective path for ground-fault current to return to the source.

It is important to note that the effective ground-fault current path (typically the EGC) is intended to carry current only during ground-fault conditions. Steady-state current flow on the EGC violates the NEC and can result in safety hazards, fire risks, and the misoperation of electrical equipment.

Another important note is that the designs of grounded low-voltage electrical systems allow only a single N-G bond per separately derived system (wherein "low-voltage" refers to the range of about 50 volts ac (root-mean-square (rms) voltage) to about 1000 volts ac or about 120 volts dc to about 1500 volts dc, in accordance with the International Electrotechnical Commission's (IEC's) definition). To further illustrate this point, FIG. 1 generally exemplifies the basic layout of a properly bonded three-phase electrical system 1 having a main panelboard 10 that supplies a 480-volt rated line voltage via conduit 17 to the delta primary of a delta/wye stepdown transformer 12, the secondary of which supplies a three-phase, 4-wire 208Y/120V system via subpanel 14, which includes a conductive media (e.g., bus bars, conductors, etc.) for distributing the phases 13, neutral (grounded) conductor N, and grounding conductor G to loads (e.g., sensitive equipment) and possibly also to one or more further separately derived systems.

Figure 1:
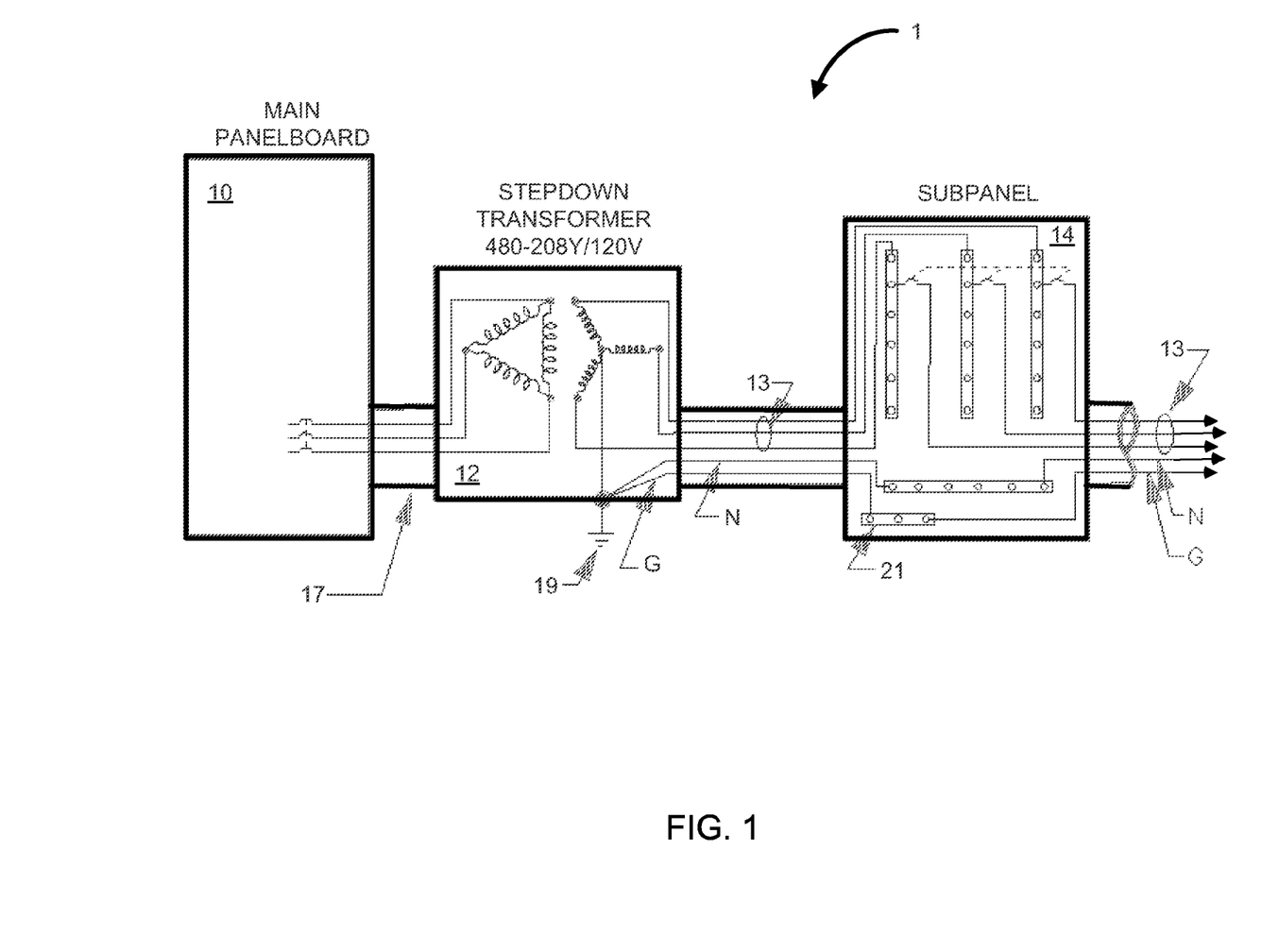
FIG. 1 illustrates an exemplary wiring of a three phase electrical system.

As shown, the 208Y/120V system has a single point of bonding between the grounding conductors G and the grounded conductors N at the enclosure of the step-down transformer 12, which is connected to the grounding system 19 (e.g., comprising a grounding electrode conductor and a grounding electrode). Grounding conductor G is not intentionally connected (nor, therefore, ground bus bar 21) to the enclosure of subpanel 14, which is grounded by a supplemental means (e.g., a separate grounding system), or by grounding system 19 via a raceway between the enclosures of subpanel 14 and transformer 12. Unless a new electrical system is derived (e.g., another transformer downstream from the subpanel), there shall be no other bonds between the grounded conductor (e.g., the neutral wire) and the grounding conductor (e.g., the green wire, green-yellow wire, bare copper wire). The reason this configuration is not allowed is that supplemental N-G bonds will provide a complete path resulting in steady-state current flow on the grounding conductor. As previously mentioned, ground currents can result in safety hazards and equipment reliability issues.

Measuring N-G voltages inherently requires a known impedance (Z) between the N-G so that the small current flow across that known impedance can be used to calculate the voltage via Ohm's Law. As a practical matter, this impedance (Z) is essentially a high-resistance connection between the grounded conductor and the grounding conductor. Assuming the impedance (Z) is high, the current flow will be small. Applying multiple metering devices or intelligent electronic devices (IEDs) on the same source, however, will result in additional current flow that is dependent on the number and location of the metering devices or IEDs and their respective impedances between the grounded and grounding conductors. Generally, however, N individual impedances on the same source will add in parallel to produce an equivalent impedance; as such, where each of N individual impedances have equal impedance, the equivalent impedance will be the individual impedance divided by N.

Figure 2A:
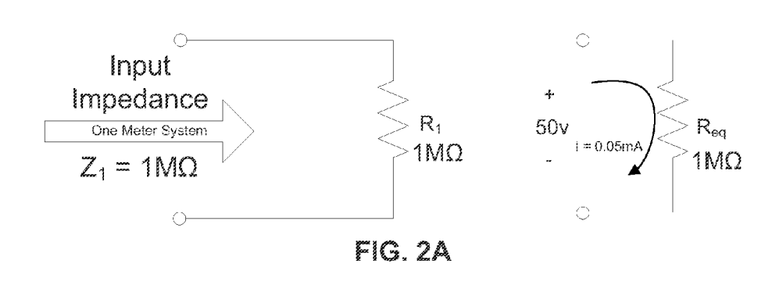
FIG. 2*a* schematically depicts the N-G impedance in a simple one-meter system.
Figure 2B:
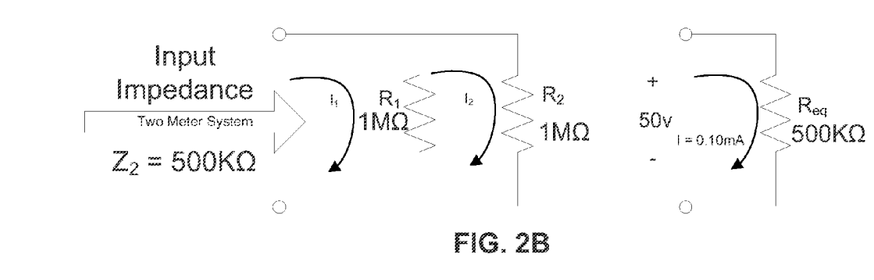
FIG. 2*b* schematically depicts the N-G impedance in a two-meter system.
Figure 2C:
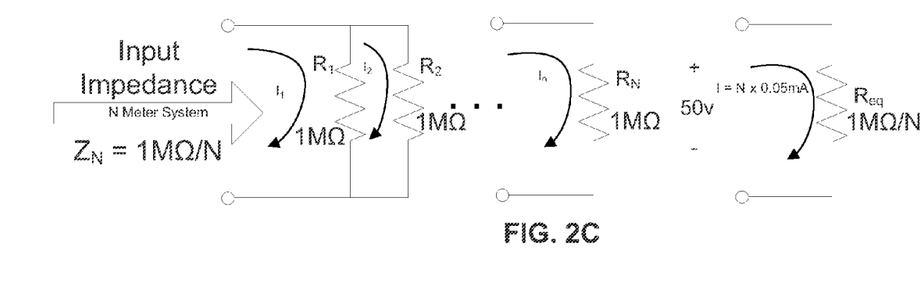
FIG. 2*c* schematically depicts the N-G impedance in an N-meter system.
Figure 2D:
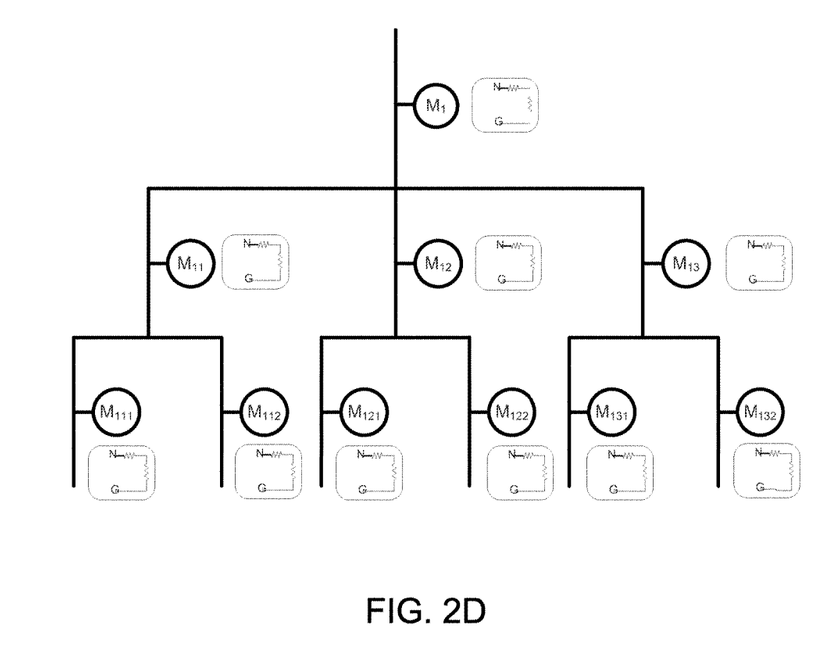
FIG. 2*d* illustrates potential current paths in a radial-fed N-meter system.

FIGS. 2a-2c below provide an example of the impact of multiple meters measuring the N-G voltage on an electrical system. In FIG. 2a, a single meter with a N-G voltage of 50 volts across 1 MΩ of impedance results in 0.05 mA of steady-state current between the neutral and ground. Two meters with the N-G voltage and impedance will result in twice the steady-state current (0.10 mA) flowing from the neutral to the ground as shown in FIG. 2b. Finally, FIG. 2c shows N meters with a N-G voltage of 50 volts across 1MΩ of impedance in each respective meter resulting in N×0.05 mA of current flowing from neutral to ground. It is unlikely that a typical installation would experience a potential of 50 volts between its neutral and ground; however, simply measuring the N-G potential will result in current flow. Thus, more installed meters (or other devices with an impedance between neutral and ground) with an impedance between the neutral and ground (whether the intention is to measure the N-G voltage or not) can result in elevated steady-state current flow on the ground path. Furthermore, metering devices or IEDs with the ability to measure N-G voltages are becoming more prevalent. FIG. 2D provides one example of the potential N-G current paths in a small metering system.

The 2011 NEC Codebook refers to this type of current as "objectionable current" due to the undesirable impact it can have on electrical systems as previously discussed. Possible concerns that can result from objectionable current flow on the ground path, for example, include (1) safety issues (as described in the NEC), and (2) signal and performance reference issues (as described in IEEE Std. 1100-2005). Both directly impact the ability of an energy consumer to safely and/or effectively meet their commercial objectives.

SUMMARY

Some embodiments of the present invention are directed to methods and apparatus for methods providing for measuring neutral-to-ground voltages and reducing ground currents caused by the measurements.

Some embodiments are directed to a method for controlling a plurality of intelligent electronic devices (IEDs) disposed at respective locations of an electrical system, each IED being configured for measuring a signal representing a neutral-to-ground (N-G) voltage at the respective location of the electrical system, each having an associated impedance that is coupled to the N-G voltage when the IED is measuring the signal representing the N-G voltage, the method comprising causing communication of signals to control when each of the IEDs is selectively coupled to the N-G voltage, the signals being operable to cause the IEDs to be selectively coupled to the N-G voltage such that the associated impedance of at least one of the plurality of IEDs is not coupled to the N-G voltage while another of the plurality of IEDs is measuring the N-G voltage.

In some embodiments, a system comprises an IED operable to measure a neutral-to-ground voltage of an electrical system and having an impedance; and a switch having a closed position for coupling the impedance of the IED with the electrical system and an open position for decoupling the impedance of the IED from the electrical system, wherein the switch is operable to be closed to measure the neutral-to-ground voltage and to be opened decouple the neutral-to-ground voltage from the impedance of the IED.

According to some embodiments, a system comprises a controller operable to send a signal that causes a switch to change states between an open position and a closed position, wherein the switch comprises a first position for placing an impedance of an IED into an electrical system and a second position for removing the impedance of the IED from the electrical system, and wherein the IED is operable to measure a neutral-to-ground voltage when the switch is in the first position.

Some embodiments are directed to an IED comprising a plurality of inputs configured for coupling to a first conductor and a second conductor of an electrical system; and a switch that is operable to switch between a first position in which an impedance of the IED is coupled to the first and second conductors and a second position in which the impedance of the IED is decoupled from the first and second conductors, wherein the IED is operable to measure a signal representing the voltage between the first and second conductors when the switch is in the first position. The first conductor and second conductors may be a grounded (neutral) conductor and a grounding conductor.

Systems according to some embodiments may comprise at least one computer and at least one non transitory computer readable medium storing thereon computer code which when executed by the at least one computer causes the at least one computer to be operable in executing a method according to one or more of the embodiments summarized above.

Some embodiments provide at least one non transitory computer readable medium that stores programming code that when executed by at least one computer, instructs the at least one computer to execute a method according to one or more of the embodiments summarized above.

Throughout the specification and claims, the following terms take at least the meanings explicitly associated herein, unless the context dictates otherwise. The meanings identified below do not necessarily limit the terms, but merely provide illustrative examples for the terms. The phrase "an embodiment" as used herein does not necessarily refer to the same embodiment, though it may. In addition, the meaning of "a," "an," and "the" include plural references; thus, for example, "an embodiment" is not limited to a single embodiment but refers to one or more embodiments. Similarly, the phrase "one embodiment" does not necessarily refer the same embodiment and is not limited to a single embodiment. As used herein, the term "or" is an inclusive "or" operator, and is equivalent to the term "and/or," unless the context clearly dictates otherwise. The term "based on" is not exclusive and allows for being based on additional factors not described, unless the context clearly dictates otherwise.

It will be appreciated by those skilled in the art that the foregoing brief description and the following detailed description are exemplary (i.e., illustrative) and explanatory of the present invention, but are not intended to be restrictive thereof or limiting of the advantages which can be achieved by this invention in various implementations. Additionally, it is understood that the foregoing summary and ensuing detailed description are representative of some embodiments of the invention, and are neither representative nor inclusive of all subject matter and embodiments within the scope of the present invention. Thus, the accompanying drawings, referred to herein and constituting a part hereof, illustrate embodiments of this invention, and, together with the detailed description, serve to explain principles of embodiments of the invention.

BRIEF DESCRIPTION OF THE DRAWINGS

Aspects, features, and advantages of some embodiments of the invention, both as to structure and operation, will be understood and will become more readily apparent when the invention is considered in the light of the following description made in conjunction with the accompanying drawings, in which like reference numerals designate the same or similar parts throughout the various figures, and wherein.

DETAILED DESCRIPTION

As will be more fully understood in view of the ensuing disclosure, some embodiments of the present invention provide for ensuring that electric meters/IEDs do not adversely affect the veracity of the electrical system where they are installed. Additionally, some embodiments of the present invention address issues that are not considered by known metering devices/IEDs and power monitoring methods and further provide improvements in metering device/IEDs and power monitoring methods with respect to, for example, safety, accuracy, and impact on the surrounding electrical infrastructure. It will be understood, however, that various embodiments of the present invention may be implemented without necessarily providing each or all of such and other advantages that may be provided by the practicing the present invention in its various forms.

In the present disclosure, including the foregoing and ensuing description, an intelligent electronic device (IED) may refer to any device, component, equipment, or the like, that includes local intelligence (e.g., provided by hardware and/or software, such as a program controlled processor and/or or dedicated control circuitry, etc.), monitoring or metering and/or control capabilities, as well as the capability to communicate directly and/or indirectly (e.g., via another IED) with an external device (e.g., a local or remote computer, which may implement a SCADA or energy management (EM) system). Such communication capability may include, for example, upper level communications (e.g., direct communications with a SCADA and/or EM system) and/or low level communications (e.g., direct communications with a local computer/controller via an I/O port/interface for IED configuration and/or uploading/transferring stored data).

With respect to its monitoring or metering functionality, an IED may comprise a meter device that measures and records, for example, one or more energy or power related characteristics or events, such as power quality, current, voltage, voltage waveforms, harmonics, transients, and/or other power disturbances. For instance, an IED comprising an electrical power metering device may detect, monitor, report, quantify and communicate power quality information about the power being monitored thereby.

It may be understood that while an IED may comprise a power and/or energy meter that includes local intelligence and monitoring functionality as well as communication functionality, an IED is not necessarily limited to or coextensive with such a "power" meter and/or "energy" meter, though in some implementations it may be. For example, it is possible to have a piece of equipment (e.g., a variable speed drive, a computer numerical controlled machine, an uninterruptable power supply (UPS), etc.) that has such power and/or energy metering capabilities in addition to other functionality; thus, the piece of equipment may be considered an IED, though the equipment's components that provide the metering capabilities may also be viewed as an IED. Yet, in some implementations, an IED may be a meter that is a separate device, not a metering component of a piece of equipment having additional functionality.

By way of example, therefore, an IED may refer to devices such as sensors, actuators, smart power equipment (e.g. intelligent circuit breakers, switch gears and power transformers, variable speed drives, uninterruptible power supplies, computer numerical controlled machines), protection units, protective relays, electronic meters, electric power meters, fault detectors/recorders, substation control units, Remote Terminal Units (RTUs), Programmable Logic Controllers ("PLC's"), traditional I/O modules for PLC systems, legacy mechanical or electromechanical devices that have been retrofitted with appropriate hardware and/or software allowing integration with an EM or SCADA system, and any other devices which are coupled with power distribution networks to manage and/or control the distribution and consumption of electrical power.

Further, consonant with the foregoing, it is understood that the terms "metering device," "monitoring device," "meter," "monitor," and "IED" may thus be used herein interchangeably, unless the context clearly dictates otherwise. Simply for ease of reference and clarity of exposition, however, the terms "metering module" and "monitoring module" may be used herein to more specifically refer to the components of an IED that are necessary for measuring and/or monitoring one or more electrical characteristics of a load or conductor or the like; thus, for example, these terms may not refer to an IED's communication component(s) and, as such, in some embodiments an IED may embrace a measuring or monitoring module but not be coextensive with it. The meaning of "IED" will be further understood in view of the ensuing description of illustrative embodiments.

Additionally, it is noted that as used herein, in connection with certain features or elements of some embodiments, the terms "component" and "system" may refer to a computer-related entity, either hardware, a combination of hardware and software, software, or software in execution. For example, in such context, a component may be, but is not limited to being, a process running on a processor, a processor, an object, an executable, a thread of execution, a program, and/or a computer. By way of illustration, both an application running on a server and the server can be a component. One or more components may reside within a process and/or thread of execution and a component may be localized on one computer and/or distributed between two or more computers.

Furthermore, the detailed description describes various embodiments of the present invention for illustration purposes, and embodiments of the present invention include the methods described and may be implemented using one or more apparatus, such as processing apparatus coupled to electronic media. Some embodiments of the present invention may be stored on an electronic media (electronic memory, RAM, ROM, EEPROM) or programmed as computer code (e.g., source code, object code or any suitable programming language) to be executed by one or more processors operating in conjunction with each other and/or one or more electronic storage media.

It is also noted that illustrative computer systems as disclosed herein may also include additional components and/or systems, such as network connections, additional memory, additional processors, network interfaces, input/output ports or busses. Further, it will be appreciated that the term "memory" herein is intended to include various types of suitable data storage media, whether permanent or temporary, such as transitory electronic memories, non-transitory computer-readable medium and/or computer-writable medium.

It will further be understood in view of the ensuing description that embodiments of the present invention may be implemented using one or more processing devices, or processing modules. The processing devices, or modules, may be coupled such that portions of the processing and/or data manipulation may be performed at one or more processing devices and shared or transmitted between a plurality of processing devices or modules. Indeed, it will be understood that some embodiments of the present invention may be implemented in a distributed computing environment in which shared resources, software and information are provided to computers and other devices over a network, which may include, for example, public (e.g., the Internet) and/or private networks.

Figure 3:
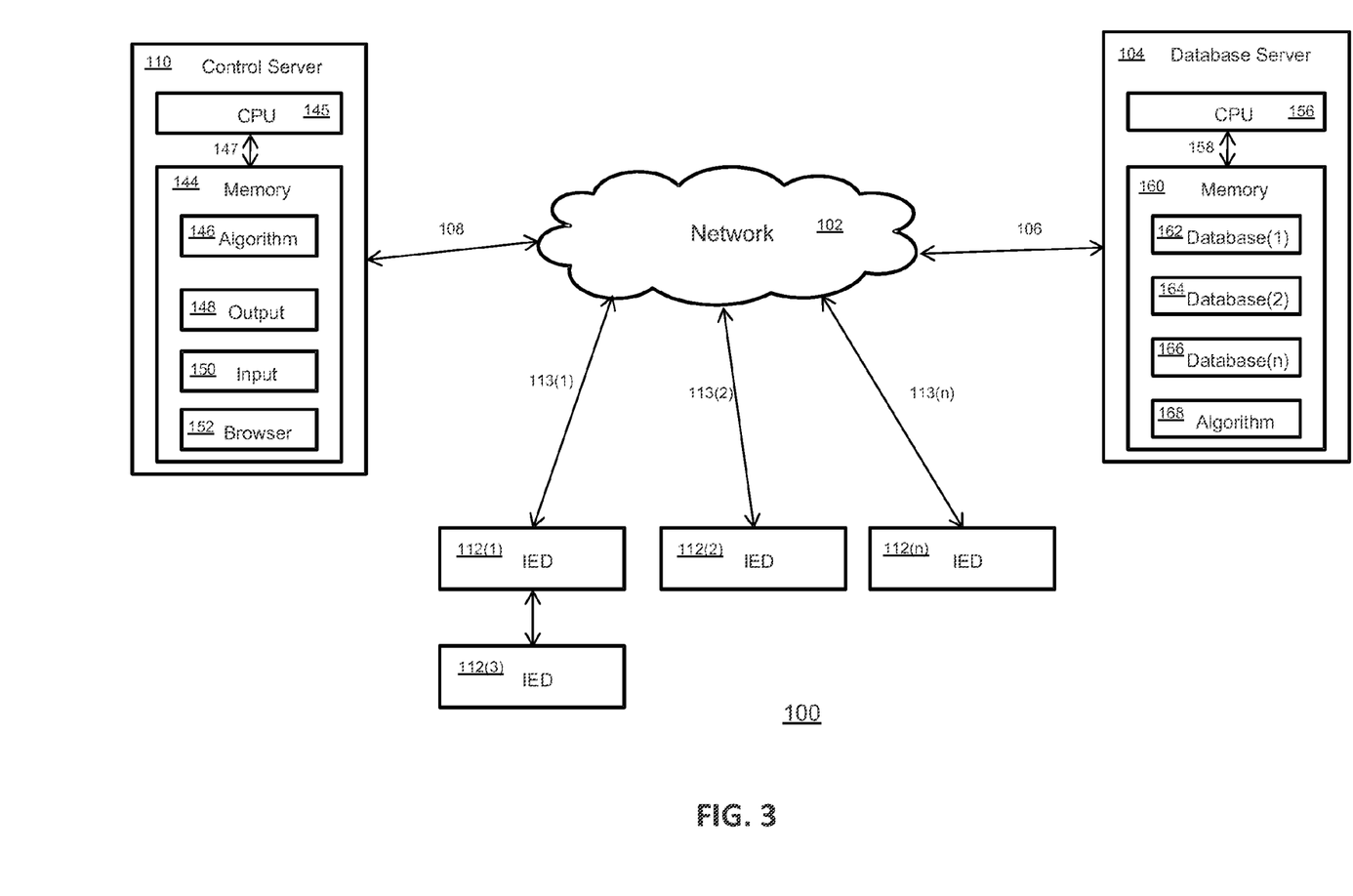
FIG. 3 illustrates a network system according to some embodiments of the present invention.

Turning now to FIG. 3, an illustrative network environment 100 that supports some embodiments of the present invention is depicted. For example, as will be further understood from the ensuing description, while some embodiments of the present invention are directed to metering devices or IEDs, various embodiments of the present invention are directed to systems and methods for controlling such metering devices or IEDs and may include control by and/or communication with one or more systems (e.g., energy management system (EMS), SCADA, etc.) via a network.

As shown in FIG. 3, the system includes a communication network 102, a Database server 104, a control server 110, and a plurality of metering devices or IEDs 112(1), 112(2), 112(3) . . . 112(n) (where "n" is any suitable integer number). The control server 110, the database server 104 and the metering devices or IEDs 112(1), 112(2), 112(n) are shown coupled to network 102 via an associated bi-directional communication medium 106, 108, 113(1), 113(2), 113(n), which may be for example a serial bus such as IEEE 1394, or other wire or wireless transmission medium.

The network 102 may comprise any public and/or private network(s) and may include, for example, any combination of linked computers, or processing devices, adapted to transfer and process data. For example, network 102 may be a local area network (LAN), a wide area network (WAN), the Internet, or any other private or public Internet Protocol (IP) network, or any combination thereof, providing for data communication between terminals (e.g., workstations, IEDs, etc.) via wired and/or wireless communication links.

The control server module, or facility, or unit, 110 is typically one or more processors with associated memory, such as computers, or other processing devices such as a desktop computer and the like. The control server 110 may also be used as an external server to which gathers data (e.g., pushed or pulled) from the metering devices or IEDs. The control server 110 includes CPU 145, which is operatively coupled to memory 144 via interconnection medium 147. The CPU 145 is a processing unit that typically includes an ALU and is configured to perform processing operations and manipulations. Memory 144 is typically an electronic storage medium that stores data in electronic format. The control server module 110 may comprise computers, or other processing devices such as a desktop computer, laptop computer, and the like. The memory 144 may comprise an algorithm 146 (e.g., operable for controlling IED N-G measurements as further described herein), output means 148, such as a monitor, input means 150, such as a keyboard or mouse, and browser software 152.

The database server module, or facility, or unit, 104 typically includes one or more processors 156 bi-directionally coupled with associated memory 160 via wired or wireless medium 158. Database server module 104 is typically a computer, server or other processing device such as a desktop computer, laptop computer, and the like. The memory 160 comprises an algorithm 168 for data analysis and a plurality of databases, database (1) 162, database (2) 164 . . . database (n) 166, (where "n" is any suitable integer number) for storing data. The database server 104 is used as a server for data analysis.

It is noted that the control server 110 and the database server 104 may be a single server, and also may be implemented as one or more separate servers (e.g., server cluster), which may be used in a cloud computing or distributed computing environment. Also, as indicated above, control server 110 may be operative in executing energy management system (EMS) and/or SCADA applications. Similarly, database server 104 may also be operative in executing various EMS and/or SCADA applications, or components thereof. For example, such EMS and/or SCADA applications may include acquiring, storing, and analyzing data acquired by metering devices or IEDs 112(1), 112(2), 112(3) . . . 112(n), such as with respect to detecting and evaluating improper grounding/grounded bonds in one or more electrical power systems being monitored.

For example, in some implementations, control server 110 may implement an algorithm (e.g., stored in memory 144) for detecting and evaluating improper grounding/grounded bonds in accordance with algorithms disclosed in U.S. Pat. No. 7,684,940, which is hereby incorporated by reference herein in its entirety. Alternatively or additionally, in some implementations, control server 110 may implement an automated hierarchy classification algorithm (e.g., also stored in memory 144) to learn the hierarchical layout of the IEDs, in accordance with algorithms disclosed in U.S. Pat. No. 7,272,518, which is hereby incorporated by reference herein in its entirety.

Additionally, as indicated above and as will be further understood, such EMS and/or SCADA applications implemented by control server 110 may include communicating with metering devices or IEDs 112(1), 112(2) . . . 112(n) to effect control over these metering devices or IEDs to, for example, prevent and/or reduce ground currents caused by N-G measurements carried out by the metering devices or IEDs. For instance, in some embodiments, EMS and/or SCADA applications may effect real-time (or near real-time) control over the time at which (or time interval over which) each respective metering device measures (e.g., samples) the N-G voltage (and/or takes other measurements). In some such embodiments, the EMS and/or SCADA may send a signal causing the meter or IED to invoke an N-G measurement in response thereto. Alternatively or additionally, EMS and/or SCADA applications may communicate data to the metering devices or IEDs, where data is indicative of when the metering device should invoke N-G measurements and is used by the metering device or IED control module to invoke a measurement (e.g., the data may indicate a specific time or times, or time of an initial measurement and periodicity or frequency of subsequent measurements, or a seed for the meter or IED's random determination of an initial measurement time, etc.).

Alternatively or additionally, however, in some implementations, one or more metering devices or IEDs may be configured to invoke N-G measurements at times determined independently of data received from a remote device (e.g., EMS and/or SCADA server, etc.) and to communicate the acquired measurement data (and any associated data, such as measurement time) to the EMS and/or SCADA. Based on received data (e.g., time information and/or measured voltages and/or other electrical parameters), the EMS and/or SCADA may determine whether two or more metering devices or IEDs are simultaneously or concurrently measuring N-G voltages on the same electrical power system and may then send one or more signals (e.g., a reset) causing at least a certain number (possibly all) of such identified meters or IEDs to take measurements at different times.

IEDs 112(1), 112(2), 112(3) . . . 112(n) (where "n" is any suitable number) are communicatively coupled (e.g., directly or indirectly) to communication network 102 via any wired or wireless connection, using any of a variety of buses and/or communications protocols. IEDs 112 (i.e., each of IEDs 112(1), 112(2), 112(3) . . . 112(n)) may be associated with a particular load or set of loads that are drawing electrical power from the power distribution system and, particularly, in the illustrative embodiment are each operable for measuring N-G voltage in one or more separately derived electrical systems. An IED 112 (i.e., one or more of IEDs 112(1), 112(2), 112(3) . . . 112(n)) may also be capable of receiving data from or controlling its associated load. For functions which produce data or other results, in various implementations, each IED 112 may push the data to another IED 112, data output device or server such as a back end server/database (e.g. server 104), automatically or event driven, or the IED 105 can wait for a requestor (e.g., another IED, or a control server 10 implementing an EM application) to pull such data therefrom, such as by way of a polling communication which requests that the data be transmitted to the requestor.

More specifically, in the illustrative embodiment IEDs 112(1), 112(2), and 112(n) are shown connected directly to the communication network 102 via associated communication medium 113(1), 113(2), 113(n). It is understood, however that IEDs need not be directly connected to the network, but may communicatively connected indirectly, such as through one or more intervening devices (e.g., through another meter or IED, an intervening server or other local processing device, etc.).

For instance, as illustratively depicted, IED 112(3) is not communicatively coupled directly to network 102 but is communicatively coupled directly to IED 112(1), which intermediates communication between IED 112(3) and control server 110 via network 102. In some implementations, such as wherein IED 112(3) may not be operable to execute upper level communications, IED 112(1) may acquire data from IED 112(3) via low level communications over a wireless or wired serial and/or parallel interface (e.g., by way of a UART, according to RS-232 or RS-485, possibly using direct memory access (DMA), etc., or any other similar data communication interfaces, techniques, protocols, etc.).

Additional IEDs that are not communicatively coupled to network 102 may be communicatively coupled directly to IED 112(1) and/or, in similar fashion, to IED 112(3), or in any connection arrangement (e.g., daisy chain, tree, etc.). Such IEDs and IED 112(1) may be viewed as a subnetwork of IEDs and may be configured according to any of various topologies, bus architectures, etc., and may employ any of various communication protocols and/or bus arbitration schemes, etc., for communication between IED 112(1) and another IED in the IED subnetwork or, in some implementations, between any IEDs in the IED subnetwork. Simply by way of example, the IED subnetwork may be configured such that communications between IED 112(1) and any other subnetwork IED may be direct, or alternatively may require passing through intervening IEDs, etc., depending on the implementation. In some implementations, such an IED subnetwork may have a master/slave configuration, with the IED that is directly connected to network 102 (e.g., IED 112(1)) acting as the master.

Additionally, in some embodiments, control over subnetwork IEDs such as for purposes of measuring N-G voltages may be controlled entirely or at least in part by one of the IEDs in the subnetwork, which may thus store N-G control algorithms in accordance with some embodiments disclosed herein. For example, such control may be executed by a subnetwork IED that is coupled directly to a network for communication with a remote control server; in the illustrative embodiment of FIG. 3, IED 112(1) may implement such N-G measurement control over IED 112(3).

While not shown in FIG. 3, it will be further understood that in some embodiments a subnetwork of IEDs may not include an IED that is communicably coupled directly to network 102 but may include one or more local computing devices (e.g., a PC, workstation, server) that does not itself include metering functionality (e.g., it is not an IED) and may be operable to intermediate communications between IEDs in the subnetwork and control server 110 (e.g., the local computing device is communicably coupled to the IEDs in the subnetwork and to network 102). Such a local computing device may additionally or alternatively or control various functions of the IEDs, such as timing control over N-G measurements in accordance with embodiments as disclosed herein (e.g., so as to reduce and/or eliminate deleterious ground currents that may be associated with the N-G measurements).

As discussed hereinabove, an IED 112 (i.e., any of IEDs 112(1), 112(2), 112(3) . . . 112(n)) may itself be a suitable metering unit or device or may be a larger apparatus (e.g., a UPS) that includes metering functionality. In addition to meter circuitry for measuring one or more electrical parameters (e.g., voltage), each metering device may comprise one or more processors (e.g., microcontrollers), memory (e.g., RAM, ROM, FLASH, etc.) and other storage media, I/O communications ports, stored data (e.g., energy consumption, parameter data logs, serial number, measurement timing information, etc.), as well as stored programs operable in controlling measurement data acquisition, communications via the network, etc. Each metering device or IED may also comprise a front panel providing a user interface that may be used, for example, for input of data or parameters (e.g., for invoking measurements or specifying measurement timing), display of measured parameters, and the like.

Each metering device or IED 112 measures (samples, collects, etc.) data from an electrical power system, and may quantify this data into characteristics that may be analyzed by a computer or analysis system (e.g., an EMS). In accordance with some embodiments of the present invention, IEDs 112 each includes metering circuitry and functionality for measuring N-G electrical characteristics (e.g., voltage) and, particularly, may include circuitry and functionality for causing the N-G metering circuitry to be selectively coupled and decoupled conductively (i.e., electrical conduction) between the grounded (neutral) and grounding conductors.

As indicated, such selective coupling of the metering circuitry of a given IED may be effected based on control signals generated exclusively (e.g., independent of control signals received from an external device such as another IED, a local processor/server, or a remote server) or in part by the given IED, or based solely on control signals received by the given IED (e.g., from another IED and/or a local processor/server and/or a remote server, etc.). By way of example, metering devices or IEDs 112 may be based on POWERLOGIC® Series 3XXX/4XXX Circuit Monitor or a POWERLOGIC® ION7XXX Power and Energy Meter available from Schneider Electric, or any other suitable metering device or IED that may be configured for measuring/monitoring one or more N-G electrical characteristics in accordance with embodiments of the present invention. It will also be understood that a device or module that is separate or separable from an IED but that is connected between a grounded (neutral) and/or grounding conductor and one or more IED inputs used for the IED metering circuitry to measure/monitor N-G electrical characteristics (e.g., voltage) may be considered as part of the IED for purposes of embodiments of the present disclosure.

Figure 4:
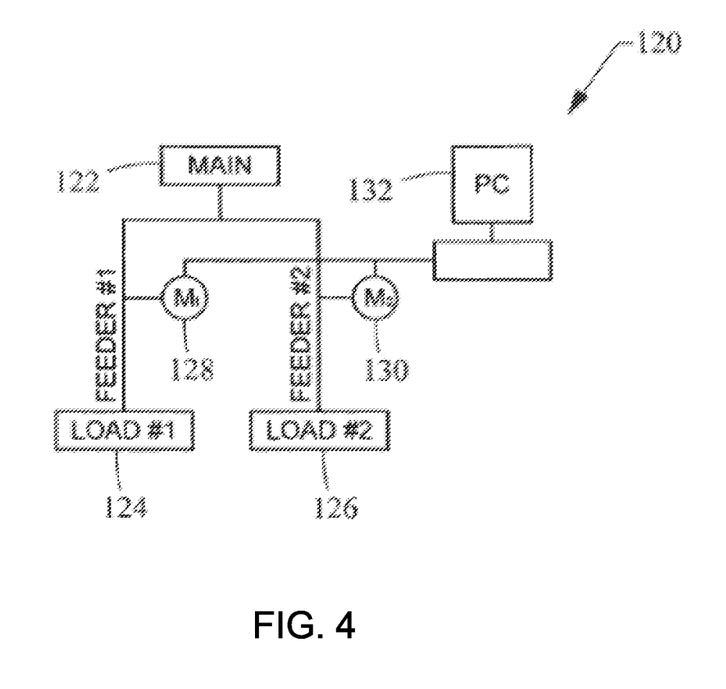
FIG. 4 illustrates a simplified view of a networked monitoring system according some embodiments of the present invention.
Figure 5:
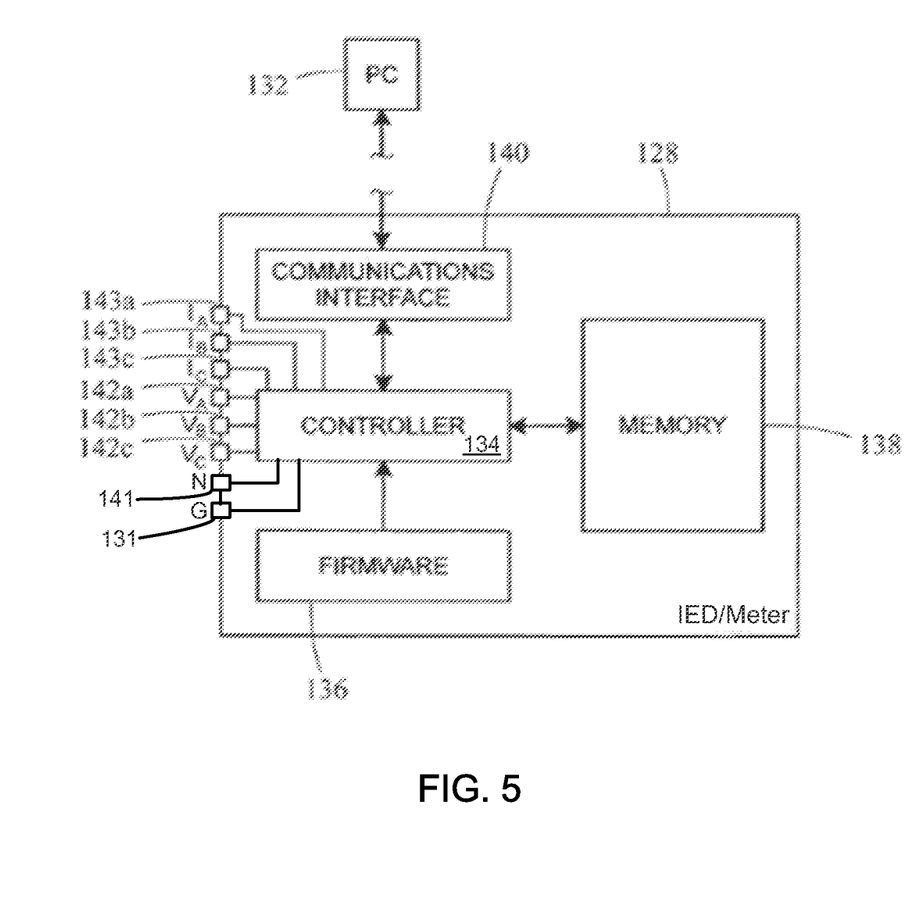
FIG. 5 illustrates a block diagram of an IED/meter according to some embodiments of the present invention.

For additional clarity, reference is now made to FIGS. 4 and 5, which respectively illustrate a simplified view of a power monitoring system and an illustrative meter or IED, in accordance with some embodiments of the present invention. In FIG. 4, a power monitoring system 120 includes a main 122 connected to a first load 124 by a first feeder and to a second load 126 by a second feeder. In accordance with this illustrative embodiment, first and second feeders each include a grounding conductor as well as a grounded (neutral) conductor in addition to one or more supply (phase) conductors. IEDs or monitoring devices 128, 130 measure electrical characteristics or parameters associated with the first and second feeders, respectively, and, particularly, IEDs 128, 130 are each configured to measure N-G voltage. Each IED 128, 130 is communicatively coupled to a computer 132, which may be local or remote.

IED 128 may be a power meter (or electric meter), such as depicted in block diagram form in FIG. 5 according to an illustrative embodiment. As shown, monitoring device 128 includes a controller 134, firmware 136, memory 138, a communications interface 140, and three phase voltage conductor connectors 142a,b,c, which connect to the $V_A$, $V_B$, and $V_C$ phase voltage conductors, respectively, and are coupled to the controller 134. Illustrative IED 128 also includes three phase current conductor connectors 143a,b,c, which connect to the $I_A$, $I_B$, and $I_C$ phase current conductors, respectively, and are coupled to the controller 134. Additionally, in accordance with some embodiments of the present invention, IED 128 also includes grounded (neutral) conductor connecter 141 and grounding conductor connector 131 for connection to grounded (neutral) conductor N and grounding conductor G of the first feeder. The firmware 136 includes machine instructions for directing the controller to carry out operations required for the monitoring device. Memory 138 is used by the controller 134 to store electrical parameter data measured by the monitoring device 128.

Instructions from the computer 132 are received by the monitoring device 128 via the communications interface 140. Those instructions may include, according to some embodiments of the present invention, instructions relating to measuring N-G voltage characteristics corresponding to the inputs to connectors 141 and 131. For example, the instructions may direct the controller 134 as to when and/or at what periodicity to measure the N-G voltage. Instructions may also direct the controller 134 to begin storing electrical parameter data, or to transmit to the monitoring system software 132 electrical parameter data stored in the memory 138. The electrical parameter data can include any data acquired by monitoring devices, including any combination of frequency, amplitude, and phase data.

Some embodiments of the present invention provide an algorithm that controls N-G voltage measurement by an IED such that this voltage is temporarily or intermittently measured (e.g., sampled), such that the measuring circuitry impedance that is conductively coupled between the grounded and grounding conductors during an N-G measurement may be selectively decoupled (e.g., disconnected) from being between the grounded and grounding conductors (e.g., when N-G measurements are not being taken). Such selective coupling/decoupling according to some embodiments is facilitated by components and associated functionality in the monitoring device 128 and/or the monitoring system software running on the computer 132. Appropriate control and measurement algorithms may be stored in memory 138 and/or firmware of IED 128.

Similarly, in various embodiments, such algorithms and/or other control and measurements components (e.g., circuitry) operable for implementing such selective coupling/decoupling may be embodied in controller 134, in the form of software, firmware, and/or hardware (e.g., a switch, dedicated circuitry such as application-specific circuitry, program controlled processor, and/or impedance networks, etc.). In this regard, as indicated above, and as will be further understood from the ensuing description, components for implementing such selective coupling/decoupling and N-G measurement may be embodied within and/or outside of the enclosure of IED 128. For example, all or part of such components may be implemented within controller 134, between input connections (e.g., inputs 131, 141) and controller 134, and/or outside of the IED enclosure and connected between the respective conductors (e.g., the grounding conductor, the grounded (neutral) conductor) and their respective IED input ports (e.g., inputs 131, 141). It is also noted that in addition to measurement data collection, IED 128 may also perform analysis of the collected data.

As discussed hereinabove, it is possible for IEDs (and/or other electrical apparatuses) to produce objectionable currents on the ground path in the course of measuring neutral-to-ground (NG) voltages. The ability to measure N-G voltages, however, is an important element in an intelligent metering solution. Some embodiments of the present invention, which may be implemented, by way of example, in connection with the illustrative systems described above with reference to FIG. 1, provides for N-G voltage measurements across multiple power monitoring devices without producing objectionable currents.

In accordance with some embodiments, contrary to the conventional perspective of considering the requirements of N-G voltage measurements as identical to those of line voltage or phase voltage measurements, measurements of N-G voltages are not necessarily provided according in a high-speed, zero-blind manner. In some embodiments, N-G voltage measurements may be carried out periodically at regular or substantially regular time intervals (e.g., once/minute, once/hour, once/day) or periodically at irregular or substantially irregular time intervals (e.g., random time intervals with a predetermined maximum interval, or at irregular times as determined by an EMS system). Employing such periodic (at regular or irregular time intervals) N-G voltage measurements provides for preventing or otherwise decreasing the likelihood of concurrent N-G measurements between two or more IEDs that may cause or increase the level of objectionable current. Some embodiments of such periodic N-G measurement may be implemented using a switch controlled as to when the N-G impedance is placed in the circuit (and hence, likewise, as to when the metering impedance is coupled between the grounded (neutral) and grounding conductors).

Figure 6:
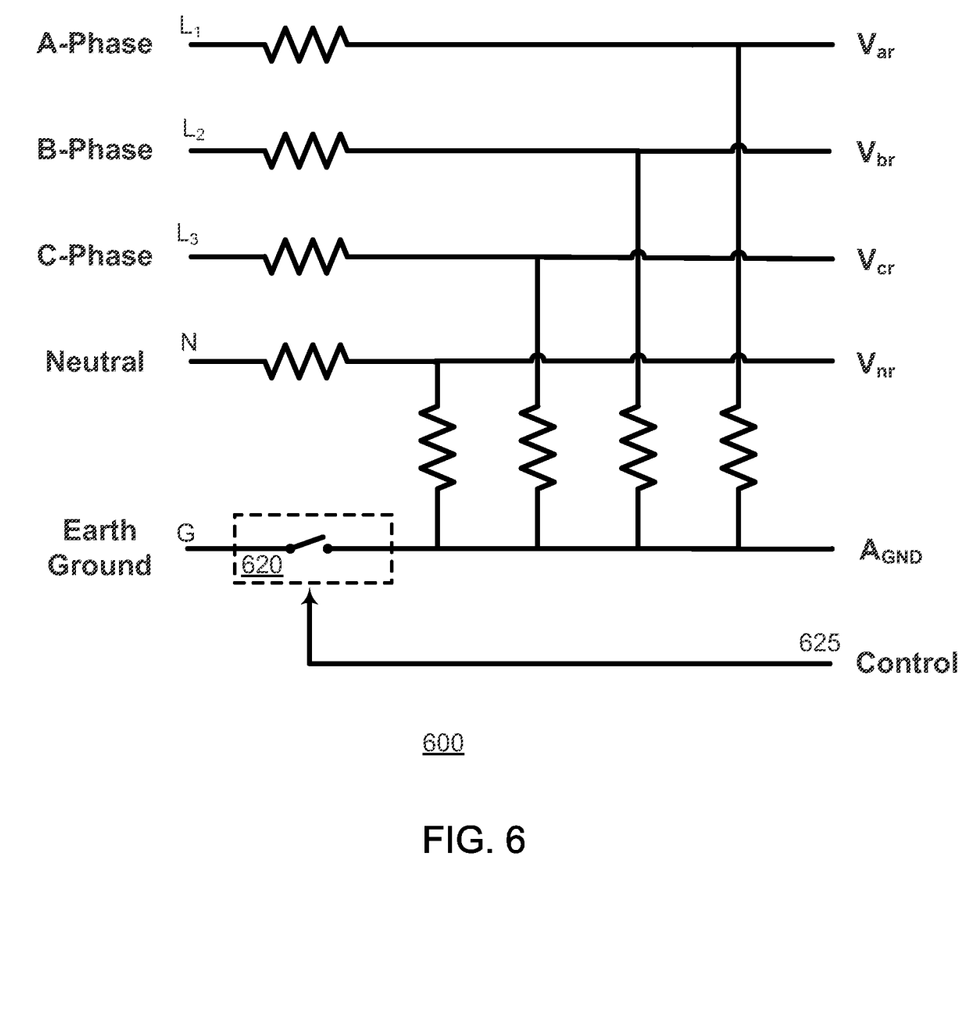
FIG. 6 schematically depicts illustrative circuitry that may be included externally at the input of and/or internally within an IED to provide for the IED to measure N-G voltage, in accordance with some embodiments of the present invention.

FIG. 6 is an illustrative schematic of circuitry 600 that includes such a switch 620 and that may be included externally at the input of and/or internally to an IED (e.g., as discussed above with reference to IED 128 of FIG. 5) to provide for the IED to measure N-G voltage, in accordance with some embodiments of the present invention. As shown, in addition to switch 620, circuitry 600 includes an impedance network (i.e., shown as resistors), which, as known to those skilled in the art, may be implemented (i) to present appropriate (e.g., very large) input impedances to the phase conductors coupled to inputs $L_1$, $L_2$, $L_3$ as well as to the grounded (neutral) conductor coupled to input N, and (ii) to provide for voltage division, so as to provide voltages at nodes $V_{ar}$, $V_{br}$, $V_{cr}$, $V_{nr}$ having magnitude levels/ranges as desired for measurement by the IED.

The switch 620 construction may be electronic (e.g., FET), mechanical (e.g., relay), and/or of any other construction (including a manual switching method at the IED) to, in accordance with some embodiments, connect and disconnect the grounding path (to earth ground) from the input G of the circuitry 600. The switch 620 may be located either internal or, alternatively, external to an IED. In some embodiments, the switch 620 may be placed into the front-end of an IED. Similarly, the impedance network, in whole or in part, may be internal and or external to the IED, independent of whether the switch 620 is internal or external. In accordance with the hereinabove disclosure, even where one or more components of circuitry 600 are located external to an IED (e.g., externally, coupled to the input of the IED), such external components may be considered as being part of the IED with which they are associated for purposes of measuring N-G voltage.

The state (i.e. opened or closed) of switch 620 is schematically depicted as being responsive to a control signal 625, which may be generated based on control component(s) (e.g., hardware and/or software) in one or more IEDs and/or other local or remote processors (e.g., computer/server, implementing an EM or SCADA application). More specifically, for example, switch 620 may be controlled locally, such as through algorithms stored within the IED (e.g., IED 112 or IED 128) with which the switch is associated for measuring N-G voltage and/or by another IED (e.g., a master IED) and/or by a local computer/host that is not an IED. In some embodiments, where the switch is external to the IED, control signal 625 may be provided by a controller component that is also external to the IED associated with the switch for measuring N-G voltage and that may be included in the same enclosure as the switch, though in some embodiments the control signal for an external switch may be generated by a controller internal to the associated IED (or, in some embodiments, internal to another IED or provided by another remote or local processor).

As discussed above, in some embodiments the switch 620 position is controlled remotely (e.g., through EMS and/or SCADA or other monitoring system software); however, embodiments may be implemented such that remote control of the switch is effected by a local controller based on communications with a remote system (e.g., EMS). It is understood, therefore, that such implementations are not mutually exclusive; the switch may be controlled in response to local and/or remote control, and local control may include control by the IED with which the switch is associated for effecting N-G voltage measurement, by another IED (e.g., a master IED), and/or by a local computer/host that is not part of a IED. Also, in some implementations the switch may include, or otherwise be coupled to, control circuitry (e.g., including, for example, a micro-controller) that is separate from other IED control circuitry and that may be directly responsive to signals (e.g., control signals) received from (i) a remote system (e.g., EMS) and/or (ii) the other IED control circuitry. In other word, those skilled in the art will understand in view of the present disclosure that there are myriad configurations for implementing a switch and its associated switching control in accordance with various embodiments of the present invention.

Controlling the switch 620 position remotely (e.g., by EMS), or locally by an external device (e.g., another IED as a master with respect to multiple slave IEDs, or a local processor/server), allows the controller (e.g., monitoring system software) to manage the switch position of IEDs simultaneously, allowing only one switch (or no more than a certain number of switches) from a plurality of IEDs on the same separately derived electrical system to be in the closed position at a time. Having only one IED associated with a given N-G electrical system measuring at a given time would reduce any objectionable current to its smallest possible magnitude while still being able to measure N-G voltages around the electrical system; however, depending on the implementation, it may be feasible to permit more than one IED to measure N-G voltage concurrently.

Furthermore, in some embodiments, switches remain in the closed position only during measurements; thus, when no measurements are occurring, all switches will be in the open position to completely eliminate the objectionable current resulting from the IEDs. The switch control may be configured such that the switch "on" time may be varied (e.g., in accordance with a stored parameter that may be rewritten, such as in response to manual input at the IED front panel and/or in response to communications received from an EMS or SCADA). It should be noted that in some implementations a reading (and consequently, a closed switch position) may be up to about one second in duration, though longer or shorter durations, re-measuring, multiple samples, etc., may be implemented.

In some embodiments, a method to control the switch positions may comprise employing an algorithm within the IED's firmware that randomly initializes the switch from the open position to the closed position, measures and stores the N-G voltage data, and then re-opens the switch. After the initial N-G voltage reading, the close-read-open process may then be performed at a regular interval by the IED. The assumption is that by randomly initializing the first reading, taking subsequent readings at some consistent periodic interval thereafter, and having an appropriate periodicity of the measurements (e.g., once/hour), the probability of two discrete IEDs having simultaneously closed switches will be minimized. The random number generator in each IED algorithm can derive its seed from the IED's unique serial number. Alternatively or additionally, this process could be initialized manually at the IED. In some embodiments, a remote management system may provide different seed data to each device.

In any case, in accordance with some embodiments, N-G voltage may be measured using an independent analog ground ($A_{gnd}$ in FIG. 6) as the internal metering reference and switching the earth ground in and out of the circuit. While there will be a leakage current through the N-G impedance when a switch position is closed, it will be temporary (i.e., not steady-state), have an infinitesimal magnitude, and be constantly repositioned within the electrical system. Moreover, it will still be possible to obtain N-G voltage readings within the principles of the NEC, providing the end-user with vital data without compromising the safety and reliability of the electrical system.

It will be appreciated from the above that embodiments of the present invention may be implemented as computer software, which may be supplied on a storage medium or via a transmission medium such as a local-area network or a wide-area network, such as the Internet. It is to be further understood that, because some of the constituent system components and method steps depicted in the accompanying figures can be implemented in software, the actual connections between the systems components (or the process steps) may differ depending upon the manner in which the present invention is programmed. Given the teachings of some embodiments of the present invention provided herein, one of ordinary skill in the related art will be able to contemplate these and similar implementations or configurations of the present invention.

It is to be understood that embodiments of the present invention can be implemented in various forms of hardware, software, firmware, special purpose processes, or a combination thereof. In one embodiment, the present invention can be implemented in software as an application program tangible embodied on a computer readable program storage device. The application program can be uploaded to, and executed by, a machine comprising any suitable architecture.

The present invention has been illustrated and described with respect to specific embodiments thereof, which embodiments are merely illustrative of some of the principles of the invention and are not intended to be exclusive or otherwise limiting embodiments. Accordingly, although the above description of illustrative embodiments of the present invention, as well as various illustrative modifications and features thereof, provides many specificities, these enabling details should not be construed as limiting the scope of the invention, and it will be readily understood by those persons skilled in the art that the present invention is susceptible to many modifications, adaptations, variations, omissions, additions, and equivalent implementations without departing from this scope and without diminishing its attendant advantages. For instance, except to the extent necessary or inherent in the processes themselves, no particular order to steps or stages of methods or processes described in this disclosure, including the figures, is implied. In many cases the order of process steps may be varied and various illustrative steps may be combined, altered, or omitted, without changing the purpose, effect or import of the methods described. Similarly, the structure and/or function of a component may be combined into a single component or divided among two or more components. It is further noted that the terms and expressions have been used as terms of description and not terms of limitation. There is no intention to use the terms or expressions to exclude any equivalents of features shown and described or portions thereof. Additionally, the present invention may be practiced without necessarily providing one or more of the advantages described herein or otherwise understood in view of the disclosure and/or that may be realized in some embodiments thereof. It is therefore intended that the present invention is not limited to the disclosed embodiments but should be defined in accordance with the claims that follow.

What is claimed is:

1. A method for controlling a plurality of intelligent electronic devices (IEDs) disposed at respective locations of an electrical system, each IED being configured for measuring a signal representing a neutral-to-ground (N-G) voltage at the respective location of the electrical system, each having an associated impedance that is coupled to the N-G voltage when the IED is measuring the signal representing the N-G voltage, the method comprising:
  causing communication of signals to control when each of the IEDs is selectively coupled to the N-G voltage, the signals being operable to cause the IEDs to be selectively coupled to the N-G voltage such that the associated impedance of at least one of the plurality of IEDs is not coupled to the N-G voltage while another of the plurality of IEDs is measuring the N-G voltage.

2. The method according to claim 1, wherein the signals are operable to cause not more than a predetermined plurality of associated impedances of the plurality of IEDs to be coupled to the N-G voltage while another of the plurality of IEDs is measuring the N-G voltage.

3. The method according to claim 1, wherein the signals are operable to prevent all of the associated impedances of all of the other of the plurality of IEDs from being coupled to the N-G voltage while each of the plurality of IEDs is measuring the N-G voltage.

4. The method according to claim 1, wherein the method is executed by a computer that is communicably coupled to the plurality of IEDs over at least one of a LAN, a WAN, and the Internet.

5. The method according to claim 1, wherein the method is executed by a computer executing energy management program code or SCADA program code.

6. The method according to claim 1, wherein the method is executed by another IED.

7. The method according to claim 6, wherein the plurality of IEDs are configured as slave devices with respect to the another IED which is configured as a master device with respect to the plurality of IEDs.

8. The method according to claim 1, wherein the signals are operable to control the time at which each of a plurality of switches associated with the plurality of IEDs is closed, each of the IED's associated impedance being coupled to the N-G voltage when the switch is closed and not being coupled to the N-G voltage when the switch in open.

9. The method according to claim 8, wherein each of the switches is operable to selectively couple the corresponding LED's associated impedance to the N-G voltage by selectively connecting a reference potential of the corresponding IED to an earth ground that is external to the corresponding IED.

10. The method according to claim 8, wherein the signals include information indicative of the duration for the switches to remain closed.

11. The method according to claim 1, wherein the signals include information used by at least one of the IEDs to generate a random value that is used by the IED to determine when the IED will be coupled to measure the N-G voltage.

* * * * *